(12) United States Patent
Kuroda et al.

(10) Patent No.: US 9,325,418 B2
(45) Date of Patent: Apr. 26, 2016

(54) OPTICAL MODULE WITH FLEXIBLE WIRING BOARD

(71) Applicant: MELLANOX TECHNOLOGIES, LTD., Yokneam (IL)

(72) Inventors: Toshitaka Kuroda, Tokyo (JP); Satoru Yoshida, Tokyo (JP); Toshiyasu Ito, Tokyo (JP)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 14/354,759

(22) PCT Filed: Oct. 25, 2012

(86) PCT No.: PCT/JP2012/077649
§ 371 (c)(1),
(2) Date: Apr. 28, 2014

(87) PCT Pub. No.: WO2013/065584
PCT Pub. Date: May 10, 2013

(65) Prior Publication Data
US 2014/0284463 A1     Sep. 25, 2014

(30) Foreign Application Priority Data
Oct. 31, 2011  (JP) ................. 2011-238676

(51) Int. Cl.
*H01J 3/14* (2006.01)
*H04B 10/40* (2013.01)
*G02B 6/42* (2006.01)

(52) U.S. Cl.
CPC .............. *H04B 10/40* (2013.01); *G02B 6/4201* (2013.01); *G02B 6/4246* (2013.01); *G02B 6/4281* (2013.01); *G02B 6/4284* (2013.01)

(58) Field of Classification Search
CPC ....................................................... G02B 6/4201
USPC .......................................................... 250/216
See application file for complete search history.

(56) References Cited

U.S. PATENT DOCUMENTS

| 7,153,043 B1 | 12/2006 | Zhang et al. |
| 2005/0168957 A1 | 8/2005 | Kawauchi et al. |
| 2007/0089900 A1* | 4/2007 | Mitamura et al. ............ 174/254 |
| 2007/0230878 A1 | 10/2007 | Nakazawa et al. |

(Continued)

FOREIGN PATENT DOCUMENTS

| CN | 1651953 A | 8/2005 |
| CN | 1790695 A | 6/2006 |

(Continued)

OTHER PUBLICATIONS

International Search Report issued in International Application No. PCT/JP2012/077649 mailed Nov. 27, 2012.

*Primary Examiner* — Thanh Luu
(74) *Attorney, Agent, or Firm* — Oliff PLC

(57) ABSTRACT

On a predetermined mounting surface of a surface (22A) of a flexible wiring board (22), a flexible wiring board pressing plate (28) which presses the mounting surface against a lower cover (12) is provided at a position immediately below a first radiation block (24) and a pressing sheet (26). The flexible wiring board pressing plate (28) has five pairs of projections (28PA and 28PB) respectively arranged in lines. The projections (28PA and 28PB) are formed to intersect conductive patterns (22ACP) at predetermined intervals.

5 Claims, 5 Drawing Sheets

(56) References Cited

U.S. PATENT DOCUMENTS

2009/0097802 A1    4/2009  Tamura et al.
2009/0285580 A1*  11/2009  Yasuda et al. ............... 398/139
2010/0074581 A1    3/2010  Tanobe et al.

FOREIGN PATENT DOCUMENTS

| | | |
|---|---|---|
| CN | 1956619 A | 5/2007 |
| CN | 101581815 A | 11/2009 |
| JP | A-2004-273924 | 9/2004 |
| JP | A-2005-217284 | 8/2005 |
| JP | A-2005-322819 | 11/2005 |
| JP | A-2006-86433 | 3/2006 |
| JP | A-2008-268587 | 11/2008 |
| JP | A-2009-98343 | 5/2009 |
| JP | A-2010-122311 | 6/2010 |
| WO | WO 2008/096716 A1 | 8/2008 |

* cited by examiner

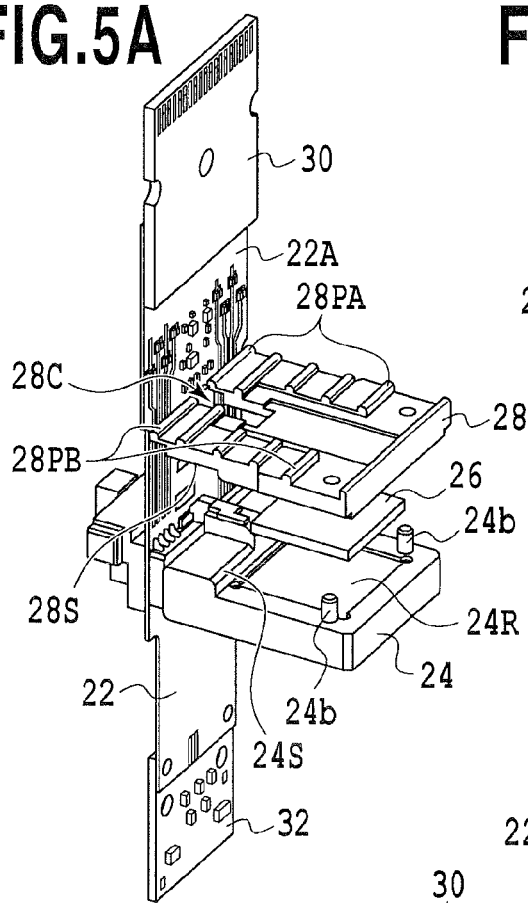
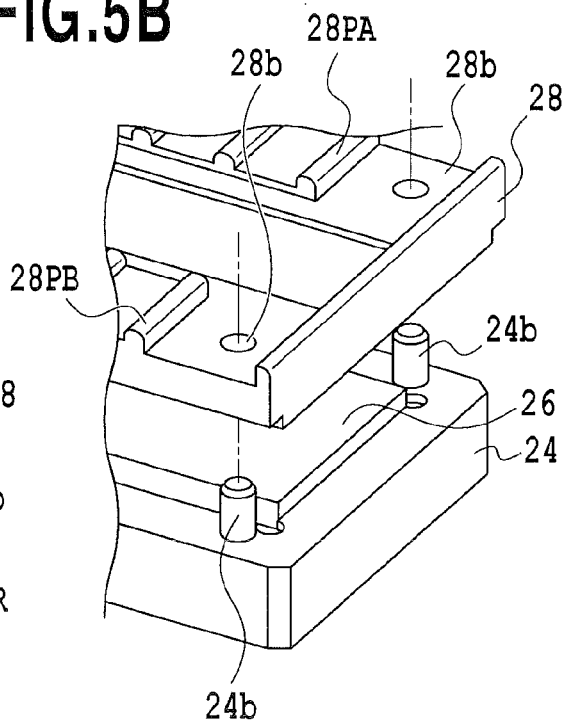
FIG.5A  FIG.5B  FIG.5C

OPTICAL MODULE WITH FLEXIBLE WIRING BOARD

TECHNICAL FIELD

The present invention relates to an optical module including an optical semiconductor element to which an optical connector is connected, and a semiconductor element for driving the optical semiconductor element and amplifying signals.

BACKGROUND ART

An XFP optical transceiver as shown in PATENT LITERATURE 1, for example, has been in practical use as an optical module in an optical communication network. The XFP optical transceiver is provided with an optical connector receptacle, and a circuit board to which a transmission module and a reception module are attached in a housing.

Moreover, as shown in PATENT LITERATURE 2, on demands for a lower profile of an optical module and for high-density packaging in the optical module, there has also been proposed an optical module which comprises: a first board provided with an optical semiconductor element; a second board provided with a semiconductor element for driving the optical semiconductor element and amplifying signals, and an electrical connector for input and output of electrical signals to outside; and a bendable flexible cable configured to electrically connect an end portion of the first board and an end portion of the second board. In addition, an MT connector having an MT ferrule serving as an optical connector as shown in PATENT LITERATURE 2, for example, has been in practical use. In the MT connector, because optical coupling between an optical semiconductor element and an optical fiber is dependent on positional accuracy of attaching guide pins as suggested in PATENT LITERATURE 2, the guide pins need to be mounted on a board with high accuracy. Accordingly, the board needs to have prescribed hardness.

CITATION LIST

Patent Literature

PATENT LITERATURE 1: Japanese Patent Laid-Open No. 2005-322819
PATENT LITERATURE 2: International Patent Application Publication No. WO2008/096716

SUMMARY OF INVENTION

There is a case where the above-described MT connector is requested to be mounted on a flexible wiring board, which is soft and shaped like a thin sheet, on demands for achieving a lower profile of an optical module and for high-density packaging in the optical module. For example, there is a case where a flexible wiring board unit prepared by positioning an MT ferrule on a flexible wiring board with an optical semiconductor element, a driver, and the like mounted on a given mounting surface is disposed in a relatively small housing. In this case, a crack may be formed in a solder layer when the flexible wiring board is bent, or a semiconductor element such as the driver may be peeled due to vibration. Thus, it can be considered that the mounting surface of the flexible wiring board unit is held down onto the inside of the housing such that the mounting surface is not bent.

However, it is not easy to hold down the mounting surface inside the housing in such a manner as to avoid adverse effects on characteristics of signals to be transmitted through signal transmission paths formed on the flexible wiring board.

In view of the above-described problem, the present invention aims to provide an optical module including an optical semiconductor element to which an optical connector is connected, and a semiconductor element for driving the optical semiconductor element and amplifying signals. The optical module can dispose a mounting surface of a flexible wiring board on which the semiconductor element is mounted to be disposed in the inside of a housing without bending the mounting surface, and avoid adverse effects on characteristics of signals to be transmitted through signal transmission paths formed on the flexible wiring board.

For the purpose of achieving the foregoing object, an optical module of the present invention comprises: a flexible wiring board having a light-emitting element, a light-receiving element, and a semiconductor element to drive the light-emitting element and the light-receiving element mounted on one surface of the flexible wiring board; a housing including a supporting surface to support the one surface of the flexible wiring board; a pressing plate to come into contact with the other surface of the flexible wiring board; and an elastic member configured to bias the pressing plate toward the other surface of the flexible wiring board disposed on the supporting surface of the housing, wherein the flexible wiring board is pinched by the pressing plate and the supporting surface of the housing.

Furthermore, in the optical module of the present invention, the flexible wiring board may include a conductive pattern formed on the other surface, and the pressing plate may include a projection to come into contact with the conductive pattern. The projection of the pressing plate may include an arc-shaped tip end portion to come into contact with the conductive pattern. The flexible wiring board may include a conductive pattern formed on the one surface, and the supporting surface of the housing may include a recessed portion corresponding to the other conductive pattern on the flexible wiring board. The housing may be formed from a metallic material. The elastic member may be pinched between a radiation member provided in an inner peripheral portion of a containing portion of the housing and the holding member.

According to the optical module of the present invention, the flexible wiring board is held between the pressing plate and the supporting surface of the housing. This makes it possible to place a mounting surface of the flexible wiring board on which the semiconductor element is mounted in the inside of the housing without bending the mounting surface, and to avoid adverse effects on characteristics of signals to be transmitted through signal transmission paths formed on the flexible wiring board.

BRIEF DESCRIPTION OF DRAWINGS

FIG. 5A is a perspective view made available for explaining procedures for assembling the first radiation block and the pressing plate;

FIG. 5B is an enlarged perspective view showing a main part of the example shown in FIG. 5A; and FIG. 5C is a perspective view for made available explaining procedures for assembling the first radiation block and the pressing plate.

DESCRIPTION OF EMBODIMENTS

Figure 2:
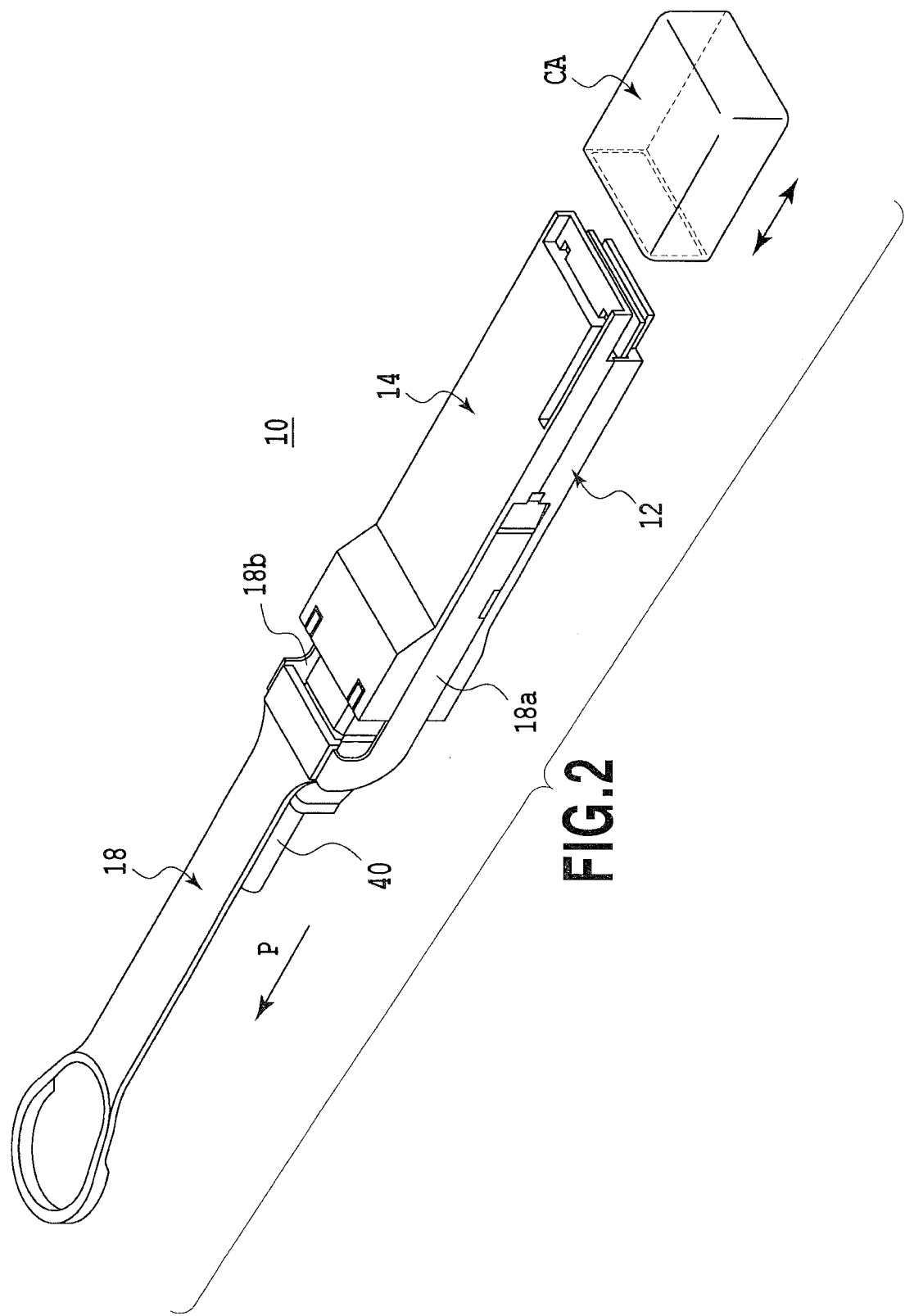
FIG. 2 is a perspective view showing an external appearance of the example of the optical module according to the present invention together with a dust cap.

FIG. 2 shows an external appearance of an example of an optical module according to the present invention.

In FIG. 2, an optical module 10 is configured to connect electrically a communication system (not shown) to be connected to an optical fiber 40 with a receptacle assembly (not shown) to which the optical module 10 is attachably and detachably connected.

The optical module 10 comprises, as main components: an upper cover 14 forming an upper part of a housing; a lower cover 12 forming a lower part of the housing; and an optical module body portion 20 (see FIG. 3) disposed in an internal space formed by being covered with the upper cover 14 and the lower cover 12.

Moreover, the optical module 10 comprises a pull tab 18 provided with lock-unlock arms 18a and 18b, which are arranged slidably on two side surface portions of the upper cover 14 and of the lower cover 12. Each of the lock-unlock arms 18a and 18b is biased in a direction opposite to a direction indicated with an arrow P by a not-illustrated coil spring. Hereby, when the pull tab 18 made of a synthetic resin is operated in the direction indicated with the arrow P, the lock-unlock arms 18a and 18b are unlocked from the receptacle assembly. Herewith, the optical module 10 is detachable from the receptacle assembly. On the other hand, when the optical module 10 is attached to the receptacle assembly and then released therefrom, the lock-unlock arms 18a and 18b of the pull tab 18 are locked to the receptacle assembly. Hereby, the optical module 10 is unlikely to come off the receptacle assembly.

In addition, a dust cap CA is provided. The dust cap CA having one open end is attachable and detachable to tip end portions of the upper cover 14 and the lower cover 12 in directions indicated with arrows. The dust cap CA is configured to cover a front end portion of a card edge board 30 constituting part of the optical module body portion 20 to be described later as well as the tip end portions of the upper cover 14 and the lower cover 12 when the optical module 10 is not in use.

Figure 3:
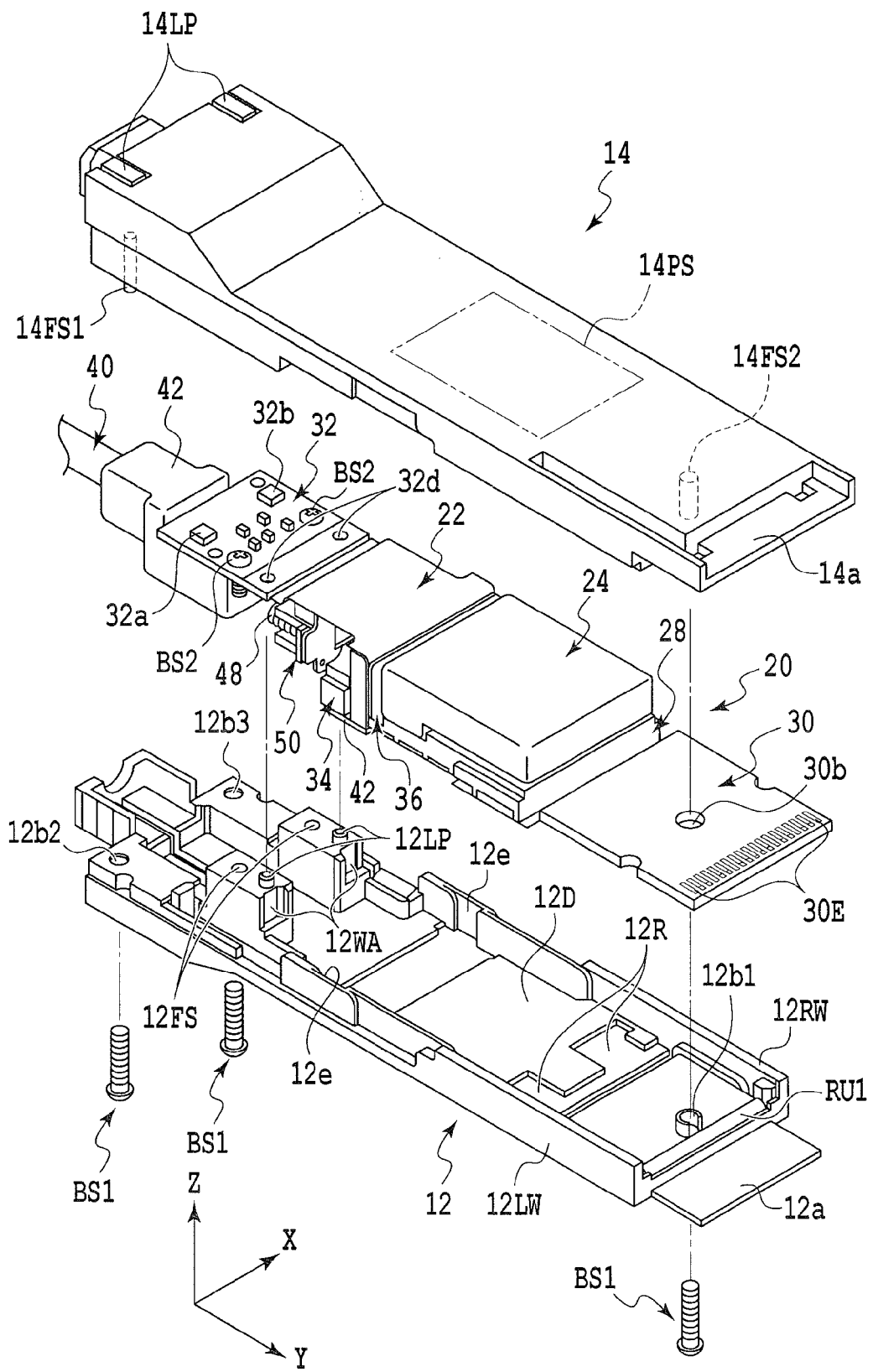
FIG. 3 is an exploded perspective view showing components of the example shown in FIG. 2.

The upper cover 14 and the lower cover 12 to be described later are each formed from a metallic material having excellent heat conductivity, such as a zinc aluminum alloy. As shown in FIG. 3, light-emitting portions 14LP of light pipes placed inside one end portion of the upper cover 14 are provided at two positions of a portion of the upper cover 14 corresponding to a light-emitting diode (LED) board 32 that constitutes part of the optical module body portion 20 to be described later. Each light-emitting portions 14LP arranged at a predetermined interval along an X coordinate axis in an orthogonal coordinate system in FIG. 3 is formed integrally with the light pipes that are not illustrated therein. Incidentally, the X coordinate axis extends substantially parallel to short sides of the upper cover 14, and a Y coordinate axis orthogonal to the X coordinate axis extends substantially parallel to long sides of the upper cover 14.

Figure 1:
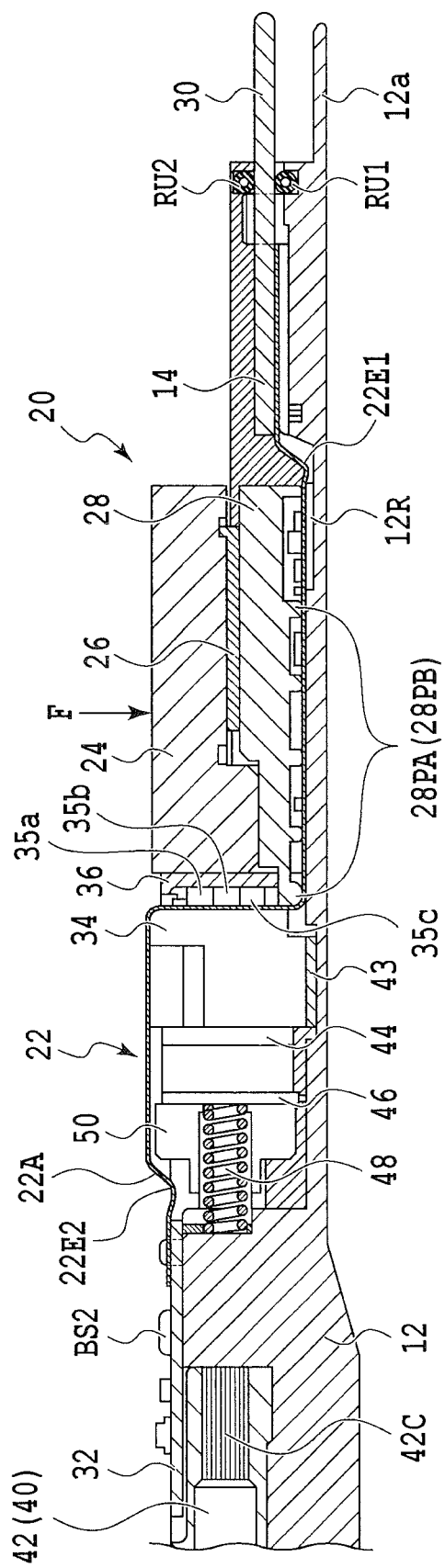
FIG. 1 is a partial cross-sectional view showing a main part of an example of an optical module according to the present invention.

Female screw portions 14FS1 are provided at two positions of a part immediately below the light-emitting portions 14LP at an inner peripheral portion of the upper cover 14. Machine screws BS1 for fixing the lower cover 12 to the upper cover 14 which will be described later are screwed into the female screw portions 14FS1. The female screw portions 14FS1 are formed to face through-holes 12b2 and 12b3 in the lower cover 12, respectively. Moreover, a female screw portion 14FS2 is provided at an inner peripheral portion of a part of the upper cover 14 covering the card edge board 30. Another machine screw BS1 for fixing the lower cover 12 to the upper cover 14 which will be described later is screwed into the female screw portion 14FS2. The female screw portion 14FS2 is formed to face a through-hole 30b in the card edge board 30 as well as a through-hole 12b1 in the lower cover 12. As shown in FIG. 1, a sealing rubber tube RU2 is provided in a groove formed in a position adjacent to the female screw portion 14FS2. Moreover, a flat pressing surface 14PS is formed substantially in a central part of the inner peripheral portion of the upper cover 14 between the female screw portions 14FS1 and the female screw portion 14FS2 along the Y coordinate axis. The pressing surface 14PS is configured to come into contact with a surface of a first radiation block 24 to be described later and to press the first radiation block 24 with a predetermined pressure when the upper cover 14 and the lower cover 12 are integrated by using the machine screws BS1. An engagement portion 14a provided with a recessed portion is formed in a tip end portion of an outer peripheral portion of the upper cover 14. The engagement portion 14a is engaged with the receptacle assembly (not shown).

As shown in FIG. 1, the optical module body portion 20 comprises, as main components, a flexible wiring board 22, the card edge board 30 to be connected to one end 22E1 of the flexible wiring board 22, and the LED board 32 to be connected to the other end 22E2 of the flexible wiring board 22.

A connection end portion of the LED board 32 is electrically connected to the other end 22E2 of the flexible wiring board 22. As shown in FIG. 3, at the connection end portion, a pair of through-holes 32d which are engaged with locating pins 12LP of the lower cover 12 to be described later is formed at a predetermined interval, when the upper cover 14 and the lower cover 12 are integrated. The connection end portion of the LED board 32 is fixed to the lower cover 12 by means of a pair of machine screws BS2 that are screwed into a pair of female screw holes 12FS provided in bases of the lower cover 12. Further, a cable connector 42 to which an optical fiber cable 40 is connected is placed in an end portion of the LED board 32 facing the connection end portion. A cable 42C (see FIG. 1) extending from the cable connector 42 is connected to an MT ferrule 44 to be described later. The LED board 32 comprises multiple LEDs 32a and 32b configured to indicate an operating state of the optical module 10 including a connection status of the optical module 10. The LEDs 32a and 32b are provided at positions immediately below the light-emitting portions 14LP of the light pipes described above.

As shown in FIG. 1, the card edge board 30 is electrically connected to the one end 22E1 of the flexible wiring board 22. A contact pad group 30E (see FIG. 3) is formed in an end portion of the card edge board 30 facing an end portion to be connected to the one end 22E1 of the flexible wiring board 22. The contact pad group 30E is formed from a plurality of contact pads formed at predetermined intervals along the X coordinate axis indicated in FIG. 3. The through-hole 30b into which the above-described machine screw BS1 is inserted is formed in a central part of the card edge board 30. When the upper cover 14 and the lower cover 12 are integrated, a portion between the through-hole 30b and the group of contact pads 30E of the card edge board 30 is pinched by the above-described rubber tube RU2 and a sealing rubber tube RU1 on the lower cover 12 to be described later, as shown in FIG. 1.

Hereby, the portion which the contact pad group 30E are formed, projects outward from a space between the engagement portion 14a of the upper cover 14 and an engagement portion 12a of the lower cover 12. Accordingly, the portion which the contact pad group 30E is defined, is formed as a plug portion to be connected to the receptacle assembly that is provided on a printed wiring board in a given electronic device.

The flexible wiring board 22 has a configuration in which multiple conductive layers covered with protecting layers are formed on an insulating base material, for example. The insulating base material is formed from a liquid crystal polymer, polyimide (PI), polyethylene terephthalate (PET) or polyetherimide (PEI) having a thickness of about 50 µm, for example. Moreover, each conductive layer is formed from a copper alloy layer having a thickness of about 12 µm, for example. Each protecting layer is formed from a thermosetting resist layer or a polyimide film, for example.

As shown in FIG. 1, a portion of the flexible wiring board 22 from the one end 22E1 to the other end 22E2 passes immediately below a flexible wiring board pressing plate 28 to be described later, which is adjacent to the card edge board 30. Thereafter, the portion where a protection cap 36 is fixed to a mounting surface of one surface 22A of the flexible wiring board 22 rises up vertically between the first radiation block 24 and a second radiation block 34 provided to face each other. In addition, a portion continuous with the part on which the protection cap 36 is mounted passes so as to cover an upper surface of the second radiation block 34, the MT ferrule 44, and an upper surface of an optical connector pressing component 50. In other words, the portion of the flexible wiring board 22 from the one end 22E1 to the other end 22E2 is drawn stepwise, whereby a front end portion of the flexible wiring board 22 inclusive of the card edge board 30 is formed as a lower step part of the stepped portion, while a rear end portion of the flexible wiring board 22 inclusive of the LED board 32 is formed as an upper step part of the stepped portion.

Figure 4:
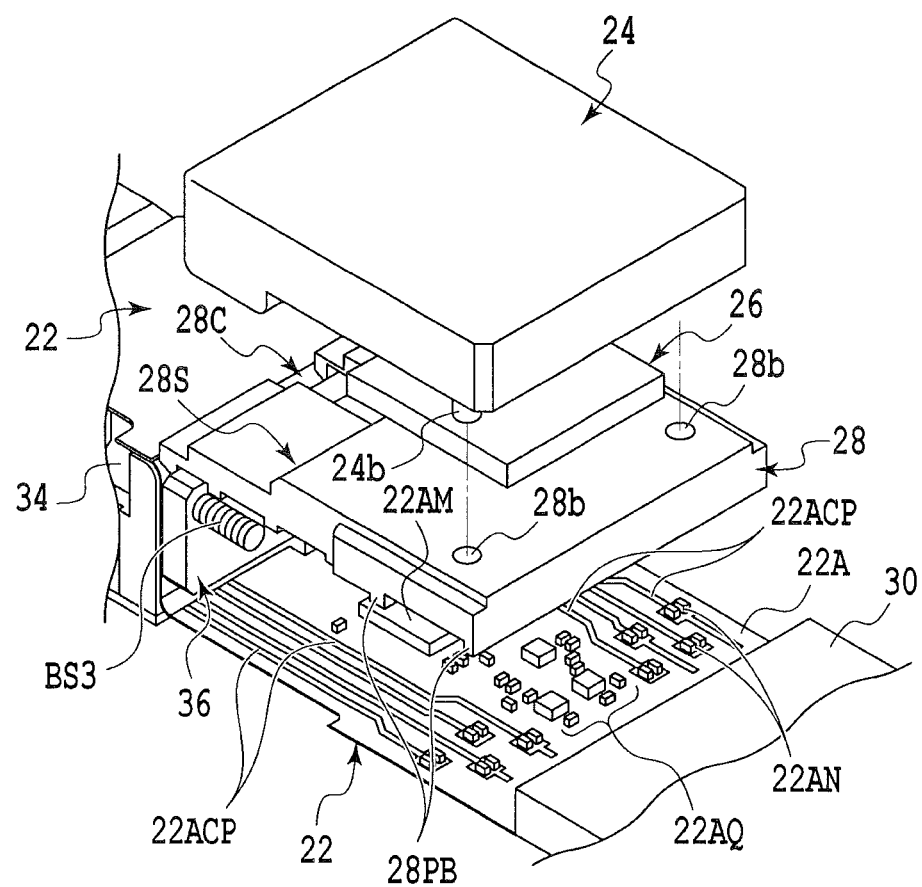
FIG. 4 is a partial perspective view showing of a first radiation block and a pressing plate which are used in the example shown in FIG. 2.

As enlargedly shown in FIG. 4, predetermined multiple semiconductor elements are mounted on a portion of the flexible wiring board 22 immediately below the flexible wiring board pressing plate 28. In addition, multiple conductive patterns 22ACP as conductive layers forming high-speed transmission paths to transmit signals are formed at the section in such a manner as to extend along the Y coordinate axis indicated in FIG. 3 immediately below the flexible wiring board pressing plate 28. As shown in FIG. 4, for example, the predetermined multiple semiconductor elements comprise: a microcomputer 22AM which is an integrated circuit configured to control operations of a driver and a receiver to be described later; a noise filter (capacitor) group 22AN for signals related to the driver and the receiver; and a semiconductor component group 22AQ. The semiconductor component group 22AQ consist of resistors, MOSFETs, and the like which are related to operations of the microcomputer 22AM.

A portion on the surface 22A of the flexible wiring board 22 facing the protection cap 36 is provided with at least optical semiconductor elements configured to perform interconversion between optical and electrical signals. Specifically, as shown in FIG. 1, the portion is provided with: a light-receiving element 35b such as a photodiode and a phototransistor configured to receive optical signals from the optical fiber cable 40 and the cable connector 42 through the MT ferrule 44 serving as the optical connector; and a light-emitting element 35a such as a light-emitting diode (LED), a laser diode (LD), a surface-emitting semiconductor laser (a vertical cavity surface-emitting laser; abbreviated as VCSEL), and an edge-emitting laser diode configured to transmit optical signals to the optical fiber cable 40 through the MT ferrule 44 serving as the optical connector. A semiconductor element 35c is provided at a position adjacent to the light-receiving element 35b. The light-receiving element 35b and the light-emitting element 35a constituting the optical semiconductor elements are arranged linearly on the mounting surface of the flexible wiring board 22 along a Z coordinate axis indicated in FIG. 3. The flexible wiring board 22 also includes the receiver which is a semiconductor element for amplifying the electrical signals converted by the light-receiving element 35b, and the driver which is a semiconductor element for converting the electrical signals into the optical signals by driving the light-emitting element 35a. Heat generated from the receiver and the driver can be transferred to the protection cap 36, the first radiation block 24, and the second radiation block 34 in a balanced manner. This makes it possible to further enhance the radiation effect.

The protection cap 36 for covering the optical semiconductor elements, the receiver, and the driver is attached onto the mounting surface of the surface 22A of the flexible wiring board 22, the surface 22A facing a surface 22B (see FIG. 5C) to which the MT ferrule 44 is connected as described later. The protection cap 36 is made of a metallic material having high heat conductivity such as aluminum or a zinc alloy, and is configured to radiate the heat generated from the optical semiconductor elements as well as the semiconductor elements such as the receiver and the driver, and to transfer the heat to the first radiation block 24. Incidentally, heat conductive adhesive or heat conductive paste may be applied to surfaces of the optical semiconductor elements, the receiver, and the driver. It is possible to further enhance the radiation effect by transferring the heat generated from the optical semiconductor elements as well as the semiconductor elements such as the receiver and the driver to the protection cap 36 through such a heat conductive material.

Moreover, as shown in FIG. 3 and FIG. 5C, the optical module body portion 20 is provided with the second radiation block 34 that faces the protection cap 36. The second radiation block 34 is formed in such a manner as to surround an outer peripheral portion of the MT ferrule 44 as described later. In other words, the second radiation block 34 is provided with a substantially U-shaped groove, which extends through the second radiation block 34 along the Y coordinate axis indicated in FIG. 3 and are opened in the direction of the Z coordinate axis so that the MT ferrule 44 can move in a back and forth direction. Both side portions of the second radiation block 34 are respectively fitted into a pair of recessed portions 12e formed at inner peripheral portions at both side portions of the lower cover 12 in order to avoid movement of the second radiation block 34 relative to the lower cover 12 as described later. The second radiation block 34 is configured to come into contact with the lower cover 12 either directly or through a heat transfer sheet 43 made of an elastic material. Thereby, the heat generated from the flexible wiring board 22 is efficiently transferred to the lower cover 12 through the second radiation block 34 and the heat transfer sheet 43, and can thus be radiated to the outside. Incidentally, by interposing the heat transfer sheet 43 made of the elastic material, it is not necessary to achieve strict dimensional accuracy when establishing contact between the first radiation block 24 and the upper cover 14 and contact between the second radiation block 34 and the lower cover 12. Moreover, the configuration to cause the first radiation block 24 and the second radiation block 34 to pinch and fix the flexible wiring board 22 and the protection cap 36 is beneficial in vertically supporting a region of the flexible wiring board 22 serving as a vertical portion.

The MT ferrule 44 to be connected to the cable 42C extending from the cable connector 42 is positioned so as to face the above-mentioned optical semiconductor elements properly by using a locating pin (not shown) which penetrates a locating hole (not shown) provided in the flexible wiring board 22. Hereby, the MT ferrule 44 is slidably connected to the first radiation block 24 through the flexible wiring board 22, the protection cap 36, and the locating pin.

As shown in FIG. 1, the MT ferrule 44 is pressed by a pair of coil springs 48 against the surface 22B of the flexible wiring board 22 through the optical connector pressing component 50 and a plate 46. The optical connector pressing component 50 is formed from a synthetic resin member made of a synthetic resin material such as polyamide. The plate 46 is formed from a metallic material such as stainless steel and a zinc alloy. Note that the optical connector pressing component 50 and the plate 46 are not limited only to the above-mentioned examples, and the optical connector pressing component and the plate as a whole may be integrally formed from a metal material by zinc die-casting, for instance.

The first radiation block 24 and the second radiation block 34 are the members configured to radiate the heat generated in the flexible wiring board 22 from the respective surfaces 22A and 22B. As shown in FIG. 4 and FIG. 5C, the first radiation block 24 and the second radiation block 34 are fixed to the flexible wiring board 22 with two machine screws BS3 while pinching the flexible wiring board 22 and the protection cap 36 in between.

As shown in FIG. 5A, a recessed portion 24R in which a pressing sheet 26 is disposed is formed in a central part of an inner peripheral portion of the first radiation block 24 disposed between the protection cap 36 and the one end portion 22E1. In addition, locating pins 24b are provided to face each other at two positions on the one end portion 22E1 side around the recessed portion 24R. The locating pins 24b are configured to position the flexible wiring board pressing plate 28 relative to the first radiation block 24 as described later. Moreover, a stepped portion 24S is formed on the periphery on the protection cap 36 side of the recessed portion 24R. As shown in FIG. 5C, the stepped portion 24S is engaged with a stepped portion 28S of the flexible wiring board pressing plate 28.

The rectangular pressing sheet 26 is formed into a thin sheet shape using an elastic material such as ethylene propylene rubber.

On the predetermined mounting surface serving as a conductor formation surface of the surface 22A of the flexible wiring board 22 described above, the flexible wiring board pressing plate 28 (hereinafter also referred to as the "pressing plate") configured to press the mounting surface against a supporting surface 12D of the lower cover 12 is provided at a position immediately below the first radiation block 24 and the pressing sheet 26. The pressing plate 28 is formed from a resin material, for example, and is provided with through-holes 28b at positions corresponding to the locating pins 24b of the first radiation block 24 as shown in FIG. 4. The locating pins 24b are respectively inserted into the through-holes 28b as shown in FIG. 5B. Moreover, the stepped portion 28S is formed in an end portion on the protection cap 36 side of an outer peripheral portion of the pressing plate 28 disposed below the first radiation block 24. When the first radiation block 24 is superposed on the pressing plate 28, the stepped portion 28S is engaged with the stepped portion 24S of the first radiation block 24.

Moreover, as shown in FIG. 5A, a recessed portion for avoiding interference with the mounted semiconductor elements is formed continuously with a cutout portion 28C in a central part of an inner peripheral portion of the pressing plate 28 facing the predetermined mounting surface of the surface 22A of the flexible wiring board 22. Five pairs of projections 28PA and 28PB are formed on both sides of the periphery of the recessed portion respectively in lines along the Y coordinate axis indicated in FIG. 3. The projections 28PA and 28PB are formed in such a manner as to intersect the above-described conductive patterns 22ACP at predetermined intervals when the projections 28PA and 28PB are placed on the mounting surface. Further, as enlargedly shown in FIG. 5B, a tip end portion of each of the projections 28PA and 28PB has an arc-shaped tip end portion so as to establish line contact with the conductive patterns 22ACP instead of plane contact. Although the five projections 28PA and 28PB are formed on the pressing plate 28 in the above-described example, the present invention is not limited only to this example. The numbers of the projections 28PA and 28PB may be less than five, or six or more. Furthermore, as described later, an end portion on the protection cap 36 side of the pressing plate 28 is formed into an arc shape so that the flexible wiring board 22 can be bent easily along the end portion.

When the pressing sheet 26 and the pressing plate 28 are assembled to the flexible wiring boar 22, the first radiation block 24 is positioned on the second radiation block 34 while pinching the flexible wiring board 22 and is fixed to the board 22 by using the machine screws BS3 as shown in FIG. 5A. Then, the pressing sheet 26 is inserted into the recessed portion 24R of the first radiation block 24. Next, as shown in FIG. 5C, the stepped portion 28S of the pressing plate 28 is engaged with the stepped portion 24S of the first radiation block 24, and the pressing plate 28 is superposed on the first radiation block 24 in such a manner that the locating pins 24b are fitted into the through-holes 28b. Subsequently, as shown in FIG. 5C, the flexible wiring board 22 is bent from the side of the card edge board 30 along the arc-shaped end portion of the pressing plate 28. Then, the lower cover 12 is covered with on the surface 22B of the flexible wiring board 22 from above by using a given jig.

As shown in FIG. 3, the lower cover 12 has a portion to contain the flexible wiring board 22 and the optical module body portion 20. Such a containing portion is formed by being surrounded by a pair of side wall portions 12RW and 12RL provided along the Y coordinate axis indicated in FIG. 3. The engagement portion 12a is integrally formed on one end of the lower cover 12 which extends in a longitudinal direction beyond the pair of side wall portions 12RW and 12RL provided along the Y coordinate axis. The engagement portion 12a is opposed to the card edge board 30 and to the engagement portion 14a of the upper cover 14. The card edge board 30 is placed in an end portion on the engagement portion 12a side of a bottom portion of the lower cover 12 that connects the pair of side wall portions 12RW and 12RL. At the end portion of the bottom portion, the through-hole 12b1 into which the machine screw BS1 is inserted is formed. The sealing rubber tube RU1 is provided in the groove in the vicinity of a base end portion of the engagement portion 12a. Moreover, a portion of the flexible wiring board 22 corresponding to the first radiation block 24, the pressing sheet 26, and the pressing plate 28 is provided on the supporting surface 12D which is adjacent thereto along the Y coordinate axis indicated in FIG. 3. Moreover, recessed portions 12R are formed at adjacent positions. Conductive patterns 22BCP formed on the surface 22B of the flexible wiring board 22 as shown in FIG. 5C are placed in the recessed portions 12R with a given clearance. Hereby, since the conductive patterns 22BCP is unlikely to come into contact with the bottom portion of the lower cover 12, deterioration in characteristics of transmitted signals is thus avoided.

Recessed portions 12e into which two side portions of the second radiation block 34 are fitted are respectively formed facing each other in inner peripheral portions of the pair of side wall portions 12RW and 12RL that are adjacent to the supporting surface 12D.

A pair of bases to which fix the LED board 32 are formed in a part of the bottom portion formed in a direction further away from the positions of the supporting surface 12D and the recessed portions 12e along the Y coordinate axis. Spring receivers 12WA each for receiving an end of the corresponding coil spring 48 are formed on side surfaces of the bases. Moreover, the female screw holes 12FS into which the aforementioned two machine screws BS2 are respectively screwed are formed in upper surfaces of the bases for supporting the LED board 32. The locating pins 12LP to be engaged with the pair of through-holes 32d in the flexible wiring board 22 are also formed thereon. In addition, the through-holes 12b2 and 12b3 into which to insert the machine screws BS1 are formed in an end portion of the lower cover 12 located further away from the bases along the Y coordinate axis.

In the above-described configuration, after the lower cover 12 is covered with the surface 22B of the flexible wiring board 22 from above, the upper cover 14 is superposed on the lower cover 12 in such a way that the pressing surface 14PS together with the first radiation block 24 presses the pressing sheet 26 and the pressing plate 28. Then, as shown in FIG. 3, the three machine screws BS1 are screwed into the respective female screw holes in the upper cover 14 via the through-holes 12b1, 12b2, and 12b3 in the lower cover 12, whereby assembly of the optical module 10 is completed. At that time, the first radiation block 24 is pressed with a given pressure by the pressing surface 14PS of the upper cover 14 in a direction indicated with an arrow F in FIG. 1, i.e., in a direction to press the mounting surface of the flexible wiring board 22. Accordingly, the tip ends of the projections 28PA and 28PB of the pressing plate 28 press the surface 22B of the flexible wiring board 22 into a flat shape with the given pressure while establishing line contact with the conductive patterns 22ACP serving as the signal transmission paths. Hereby, the flexible wiring board 22 is pinched by the projections 28PA and 28PB of the pressing plate 28 and the supporting surface 12D of the lower cover 12. As a consequence, the mounting surface of the flexible wiring board 22 is bent between the inner peripheral portion of the upper cover 14 and the inner peripheral portion of the lower cover 12, so that the semiconductor elements is unlikely to come off due to vibration. In addition, since the projections 28PA and 28PB of the pressing plate 28 are formed at the predetermined intervals, signal characteristics of signals flowing on the conductive patterns 22ACP are not adversely affected. Furthermore, manufacturing errors are also accommodated since the pressing sheet 26 is crushed by a predetermined amount. Accordingly, the processing accuracy for the components does not require precision. As a consequence, it is possible to achieve reductions in manufacturing costs.

In addition, in the above-described example, the heat generated from the flexible wiring board 22 can be efficiently transferred to the upper cover 14 through the protection cap 36 and the first radiation block 24, and can thus be radiated to the outside. The optical module body portion 20 is disposed substantially horizontally while the flexible wiring board 22 bent into the stepped shape is interposed among the first radiation block 24, the flexible wiring board pressing plate 28, the second radiation block 34, and the MT ferrule 44. Thereby, the optical module 10 can achieve thin profiling and size reduction as a consequence.

Note that the covering member is not limited to the above-described example. The covering member is not limited only to the structure including the upper cover and the lower cover but may also be formed from a single component.

REFERENCE SIGNS LIST 10 optical module
12 lower cover
14 upper cover
22 flexible wiring board
24 first radiation block
26 pressing sheet
28 flexible wiring board pressing plate
30 card edge board
32 LED board
34 second radiation block
44 optical connector (MT ferrule)

The invention claimed is:

1. An optical module comprising:
a flexible wiring board having a light-emitting element, a light-receiving element, and a semiconductor element to drive the light-emitting element and the light-receiving element mounted on one surface of the flexible wiring board;
a housing having a supporting surface to support the one surface of the flexible wiring board;
a pressing plate to come into contact with another surface of the flexible wiring board; and
an elastic member configured to bias the pressing plate toward the other surface of the flexible wiring board disposed on the supporting surface of the housing, wherein
the flexible wiring board is pinched by the pressing plate and the supporting surface of the housing, and the flexible wiring board has a conductive pattern formed on the other surface, and
the pressing plate has a projection to come into contact with the conductive pattern.

2. The optical module according to claim 1, wherein the flexible wiring board has a conductive pattern formed on the one surface, and
the supporting surface of the housing has a recessed portion corresponding to another conductive pattern on the flexible wiring board.

3. The optical module according to claim 1, wherein the housing is formed from a metallic material.

4. An optical module comprising:
a flexible wiring board having a light-emitting element, a light-receiving element, and a semiconductor element to drive the light-emitting element and the light-receiving element mounted on one surface of the flexible wiring board;
a housing having a supporting surface to support the one surface of the flexible wiring board;
a pressing plate to come into contact with another surface of the flexible wiring board; and
an elastic member configured to bias the pressing plate toward the other surface of the flexible wiring board disposed on the supporting surface of the housing, wherein
the flexible wiring board is pinched by the pressing plate and the supporting surface of the housing, the flexible wiring board has a conductive pattern formed on the other surface, and the pressing plate has a projection to come into contact with the conductive pattern, and the projection of the pressing plate has an arc-shaped tip end portion to come into contact with the conductive pattern.

5. An optical module comprising:

a flexible wiring board having a light-emitting element, a light-receiving element, and a semiconductor element to drive the light-emitting element and the light-receiving element mounted on one surface of the flexible wiring board;

a housing having a supporting surface to support the one surface of the flexible wiring board;

a pressing plate to come into contact with another surface of the flexible wiring board; and an elastic member configured to bias the pressing plate toward the other surface of the flexible wiring board disposed on the supporting surface of the housing, wherein the flexible wiring board is pinched by the pressing plate and the supporting surface of the housing, and the elastic member is pinched between a radiation member provided in an inner peripheral portion of a containing portion of the housing and the pressing member.

* * * * *